(12) United States Patent
Hsu et al.

(10) Patent No.: US 10,203,252 B2
(45) Date of Patent: Feb. 12, 2019

(54) MICROELECTROMECHANICAL APPARATUS HAVING A MEASURING RANGE SELECTOR

(71) Applicant: Industrial Technology Research Institute, Hsinchu (TW)

(72) Inventors: Yu-Wen Hsu, Tainan (TW); Feng-Chia Hsu, Kaohsiung (TW); Chao-Ta Huang, Hsinchu (TW); Shih-Ting Lin, Hualien County (TW)

(73) Assignee: Industrial Technology Research Institute, Hsinchu (TW)

( * ) Notice: Subject to any disclaimer, the term of this patent is extended or adjusted under 35 U.S.C. 154(b) by 279 days.

(21) Appl. No.: 15/393,254

(22) Filed: Dec. 29, 2016

(65) Prior Publication Data

US 2018/0188115 A1  Jul. 5, 2018

(51) Int. Cl.
*G01K 7/00* (2006.01)
*G01K 1/00* (2006.01)
(Continued)

(52) U.S. Cl.
CPC .............. *G01K 7/226* (2013.01); *B81B 7/008* (2013.01); *B81B 7/02* (2013.01); *G01K 1/02* (2013.01); *G01K 2219/00* (2013.01)

(58) Field of Classification Search
USPC ........................................ 374/183, 185, 120
See application file for complete search history.

(56) References Cited

U.S. PATENT DOCUMENTS 6,133,572 A    10/2000  Cunningham
6,565,254 B2   5/2003   Sato et al.
(Continued)

FOREIGN PATENT DOCUMENTS

CN    1199036    4/2005
CN    1940512    4/2007
(Continued)

OTHER PUBLICATIONS

Zhou et al., "CMOS-Based Thermopiles Using Vertically Integrated Double Polycrystalline Silicon Layers", IEEE MEMS 2013, Jan. 20-24, 2013, pp. 429-432.
(Continued)

*Primary Examiner* — Mirellys Jagan
(74) *Attorney, Agent, or Firm* — JCIPRNET

(57) ABSTRACT

A MEMS apparatus having measuring range selector including a sensor and an IC chip is provided. The sensor includes a sensing device. The IC chip includes a voltage range selector, an analog front end, a control device and an A/D converter. The sensing device is configured to detect the physical quantity and generate a sensing voltage. The voltage range selector is configured to select a sub-voltage range having a first upper-bound and a first lower-bound. The analog front end is configured to receive the sensing voltage and output a first voltage. The A/D converter has a full scale voltage range having a second lower-bound and a second upper-bound. A ratio of the full scale voltage range to the sub-voltage range is defined as a gain factor. A difference obtained by subtracting the first lower-bound from the first voltage is defined as a shift factor. The control device is configured to adjust the first voltage to the second voltage according to the gain factor and the shift factor.

20 Claims, 4 Drawing Sheets

(51) Int. Cl.
*G01K 7/22* (2006.01)
*B81B 7/02* (2006.01)
*G01K 1/02* (2006.01)
*B81B 7/00* (2006.01)

(56) References Cited

U.S. PATENT DOCUMENTS

| | | | |
|---|---|---|---|
| 7,208,734 | B2 | 4/2007 | Shibayama |
| 7,455,450 | B2 | 11/2008 | Liu et al. |
| 8,215,831 | B2 | 7/2012 | Ernst et al. |
| 8,426,864 | B2 | 4/2013 | Tsuji et al. |
| 2012/0163410 | A1* | 6/2012 | Tsuchiya ............... G01J 5/0225 374/121 |
| 2012/0318058 | A1* | 12/2012 | Kimura ................. G01F 1/6842 73/204.23 |
| 2015/0177272 | A1* | 6/2015 | Clark .................... G01P 15/097 850/5 |
| 2016/0041038 | A1 | 2/2016 | Geiger |
| 2018/0024010 | A1* | 1/2018 | Nakagawa ............... G01K 7/02 374/135 |

FOREIGN PATENT DOCUMENTS

| | | |
|---|---|---|
| CN | 1985158 | 6/2007 |
| TW | I248513 | 2/2006 |
| TW | 200804779 | 1/2008 |
| TW | I491858 | 7/2015 |
| TW | I501386 | 9/2015 |
| TW | I510766 | 12/2015 |

OTHER PUBLICATIONS

Chen et al., "A Novel CMOS-Compatible Polysilicon/Titanium Thermopile", 2009 IEEE 3rd International Conference on Nano/Molecular Medicine and Engineering, Oct. 18-21, 2009, pp. 158-163.

Luca et al., "High-Sensitivity Single Thermopile SOI CMOS MEMS Thermal Wall Shear Stress Sensor", IEEE Sensors Journal, Oct. 2015, pp. 5561-5568.

Randjelovic et al, "Multipurpose MEMS thermal sensor based on thermopiles", Sensors and Actuators A 141, Oct. 2007, pp. 404-413.

"Notice of Allowance of Taiwan Counterpart Application," dated Jul. 4, 2016, p. 1-p. 4, in which the listed references were cited.

* cited by examiner

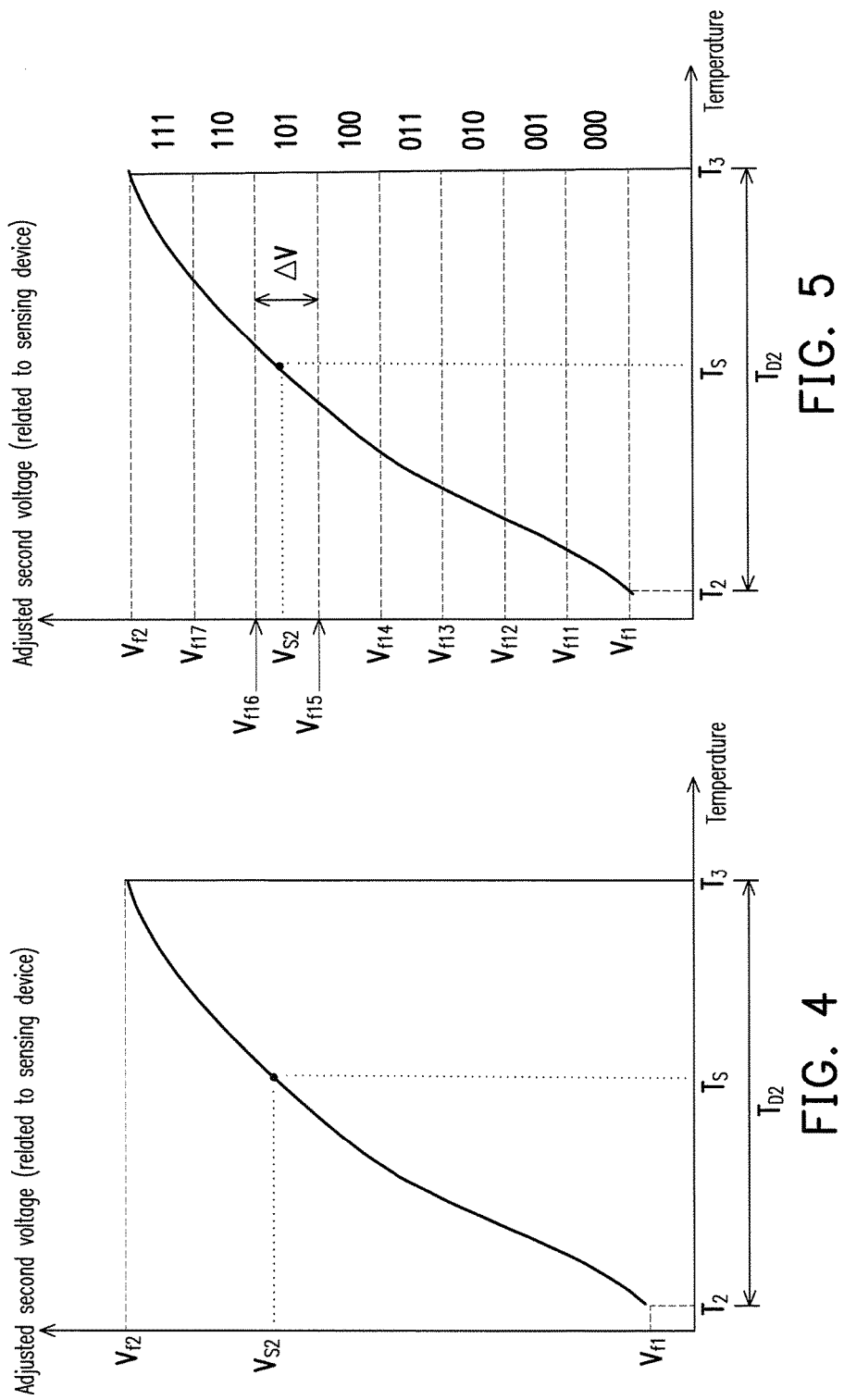

MICROELECTROMECHANICAL APPARATUS HAVING A MEASURING RANGE SELECTOR

TECHNICAL FIELD

The present disclosure relates to a MEMS apparatus having measuring range selector, and more particularly, to a MEMS apparatus with multiple measuring ranges.

BACKGROUND

In general, after a radiant heat is received by a conventional temperature sensor, the temperature of a thermoelectric device therein is increased by the heat to generate a voltage signal correspondingly. Then, a data processing device in the temperature sensor correspondingly calculates a temperature data of a target object according to the voltage signal. However, a resolution of the conventional temperature sensor is unable to satisfy demands in the current industrial applications. When the target object has multiple temperature ranges, a high bit A/D converter is generally required to further increase the resolution so the temperature data of the target object with high resolution can be obtained from the voltage signal. Nonetheless, because the high bit A/D converter costs higher, the temperature sensor with high resolution will also be higher in cost.

On the other hand, in the conventional temperature sensor, the thermoelectric device provides different voltage characteristics in temperature ranges with different intervals. Such phenomenon can lead to different sensitivities of the temperature sensor in different temperature ranges and further affect an accuracy of the temperature sensor.

SUMMARY

The present disclosure is directed a MEMS apparatus having measuring range selector, which can provide identical or similar sensitivities in the temperature ranges with different intervals as well as a higher resolution.

The present disclosure provides a MEMS apparatus having measuring range selector including a sensor and an IC chip. The sensor includes a sensing device. The IC chip includes a voltage range selector. The sensing device is configured to detect the physical quantity and generate a sensing voltage. The voltage range selector is configured to select a sub-voltage range. The sub-voltage range has a first lower-bound and a first upper-bound. An analog front end is configured to receive the sensing voltage and output a first voltage. A control device is configured to adjust the first voltage to a second voltage. An A/D converter is configured to receive the second voltage. The A/D converter has a full scale voltage range. The full scale voltage range has a second lower-bound and a second upper-bound. The first voltage is between the first lower-bound and the first upper-bound. A ratio of the full scale voltage range to the sub-voltage range is defined as a gain factor. A difference obtained by subtracting the first lower-bound from the first voltage is defined as a shift factor. The control device is configured to adjust the first voltage to the second voltage according to the gain factor and the shift factor.

In an embodiment of the present disclosure, the second voltage is obtained from a product of the gain factor and the shift factor.

In an embodiment of the present disclosure, the analog front end has a first voltage range. The first voltage range includes a sub-voltage range.

In an embodiment of the present disclosure, the sensor further includes a detecting device. The detecting device is configured to detect the physical quantity and generate an electrical signal. The voltage range selector is configured to select the sub-voltage range according to the electrical signal.

In an embodiment of the present disclosure, the IC chip further includes a memory. The memory is configured to store a first voltage-temperature diagram of the sensing device and an electrical signal-temperature diagram of the detecting device. The first voltage-temperature diagram and the electrical signal-temperature diagram respectively includes a plurality of temperature ranges, wherein the temperature ranges of the first voltage-temperature diagram are the same as the temperature ranges of the electrical signal-temperature diagram.

In an embodiment of the present disclosure, the electrical signal is an electrical resistance signal, and the electrical signal-temperature diagram is an electrical resistance-temperature diagram.

In an embodiment of the present disclosure, the voltage range selector is configured to select a first temperature range corresponding to the electrical signal according to the electrical signal-temperature diagram. The voltage range selector is configured to select a second temperature range having the same interval with the first temperature range from the first voltage-temperature diagram. Then, the voltage range selector is configured to select a voltage range corresponding to the second temperature range from the first voltage-temperature diagram to be the sub-voltage range corresponding to the first voltage, wherein an upper endpoint of the first temperature range is the same as an upper endpoint of the second temperature range, and a lower endpoint of the first temperature range is the same as a lower endpoint of the second temperature range.

In an embodiment of the present disclosure, the physical quantity is a temperature.

In an embodiment of the present disclosure, the sensing device is electrically connected to the analog front end. The detecting device is electrically connected to the voltage range selector.

In an embodiment of the present disclosure, the detecting device is a thermal radiation absorbing layer. The physical quantity is a radiant heat. The electrical signal is an electrical resistance signal.

In an embodiment of the present disclosure, the sensing device includes at least one thermal pile.

The present disclosure provides a MEMS apparatus having measuring range selector including a sensor and an IC chip. The sensor includes a detecting device and a sensing device. The IC chip includes a voltage range selector. The detecting device is configured to detect the physical quantity and generate an electrical signal. The sensing device is configured to detect the physical quantity and generate a sensing voltage. The voltage range selector is configured to select a sub-voltage range. The sub-voltage range has a first lower-bound and a first upper-bound. An analog front end is configured to receive the sensing voltage and output a first voltage. A control device is configured to adjust the first voltage to a second voltage. An A/D converter is configured to receive the second voltage. The A/D converter has a full scale voltage range. The full scale voltage range has a second lower-bound and a second upper-bound. The detecting device is electrically connected to the voltage range selector. The sensing device is electrically connected to the analog front end. The first voltage is between the first lower-bound and the first upper-bound. A ratio of the full scale voltage range to the sub-voltage range is defined as a gain factor. A difference obtained by subtracting the first lower-bound from the first voltage is defined as a shift factor. The control device is configured to adjust the first voltage to the second voltage according to the gain factor and the shift factor.

In an embodiment of the present disclosure, the second voltage is obtained from the product of the gain factor and the shift factor.

In an embodiment of the present disclosure, the detecting device is a thermal radiation absorbing layer. The physical quantity is a radiant heat. The electrical signal is an electrical resistance signal.

In an embodiment of the present disclosure, the sensing device includes at least one thermal pile.

The present disclosure provides a MEMS apparatus having measuring range selector, which is adapted to sense temperatures in different ranges. The MEMS apparatus includes a sensor and an IC chip. The sensor includes a detecting device and a sensing device. The IC chip includes a voltage range selector. The detecting device is configured to detect the physical quantity and generate an electrical signal. The sensing device is configured to detect the physical quantity and generate a sensing voltage. The voltage range selector is configured to select a sub-voltage range. The sub-voltage range has a first lower-bound and a first upper-bound. An analog front end is configured to receive the sensing voltage and output a first voltage. A control device is configured to adjust the first voltage to a second voltage. An A/D converter is configured to receive the second voltage. The A/D converter has a full scale voltage range. The full scale voltage range has a second lower-bound and a second upper-bound. The detecting device is electrically connected to the voltage range selector. The sensing device is electrically connected to the analog front end. The first voltage is between the first lower-bound and the first upper-bound. A ratio of the full scale voltage range to the sub-voltage range is defined as a gain factor. A difference obtained by subtracting the first lower-bound from the first voltage is defined as a shift factor. The control device is configured to adjust the first voltage to the second voltage according to the gain factor and the shift factor. The second voltage is obtained from a product of the gain factor and the shift factor.

In an embodiment of the present disclosure, the detecting device is a thermal radiation absorbing layer. The physical quantity is a radiant heat. The electrical signal is an electrical resistance signal.

In an embodiment of the present disclosure, the IC chip further includes a memory. The memory stores a first voltage-temperature diagram of the sensing device and an electrical signal-temperature diagram of the detecting device. The first voltage-temperature diagram and the electrical signal-temperature diagram respectively includes a plurality of temperature ranges, wherein the temperature ranges of the first voltage-temperature diagram are the same with the temperature ranges of the electrical signal-temperature diagram.

In an embodiment of the present disclosure, the voltage range selector is configured to select a first temperature range corresponding to the electrical resistance signal according to the electrical signal-temperature diagram. The voltage range selector is configured to select a second temperature range having the same interval with the first temperature range from the first voltage-temperature diagram. Then, the voltage range selector is configured to select a voltage range corresponding to the second temperature range from the first voltage-temperature diagram to be the sub-voltage range corresponding to the sensing voltage.

The present disclosure provides a MEMS apparatus having measuring range selector, which is configured to sense temperatures in different ranges. The MEMS apparatus includes a sensor and an IC chip. The sensor includes a detecting device, a sensing device and a film. The sensing device includes at least one thermal pile. The detecting device is configured to detect a radiant heat and generate a sensing voltage. The detecting device includes a thermal radiation absorbing layer. The thermal radiation absorbing layer is configured to detect the radiant heat and generate an electrical signal. The thermal radiation absorbing layer is disposed on a surface of the film. The at least one thermal pile is disposed in the film. A portion of the film is disposed between the thermal radiation absorbing layer and the at least one thermal pile. The detecting device is thermally coupled to the at least one thermal pile. The thermal radiation absorbing layer is electrically connected to the IC chip.

Based on the above, in the MEMS apparatus having measuring range selector according to the embodiments of the present disclosure, the detecting device and the sensing device respectively generate the electrical signal and the sensing voltage according to the physical quantity. The voltage range selector selects the sub-voltage range according to the electrical signal from the detecting device. The control device in the IC chip adjusts the sub-voltage range to the full scale voltage range so the first voltage is also adjusted to the second voltage accordingly. Therefore, in the MEMS apparatus according to the embodiments of the present disclosure, because the voltage ranges with different sizes included by the sensor corresponding to the temperature range with different intervals may be adjusted to the same full scale voltage range, the identical or similar sensitivities can be provided in the temperature ranges with different intervals. Next, according to the number of bits, the second A/D converter in the IC chip can further divide the full scale voltage range into a plurality of different voltage ranges. As a result, the MEMS apparatus according to the embodiments of the present disclosure can further determine a smaller temperature range from the sub-voltage range according to the second voltage, so as to provide the higher resolution during temperature measurement.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 4 is a second voltage-temperature diagram obtained after the sub-voltage range in FIG. 3 is adjusted by the control device in the embodiment of FIG. 1B.

FIG. 5 is a conversion relation diagram used by the A/D converter in the embodiment of FIG. 1B for making the different sub-voltage ranges to be adjusted in the full scale voltage range of FIG. 4 corresponding to different digital codes.

DETAILED DESCRIPTION

Figure 1A:
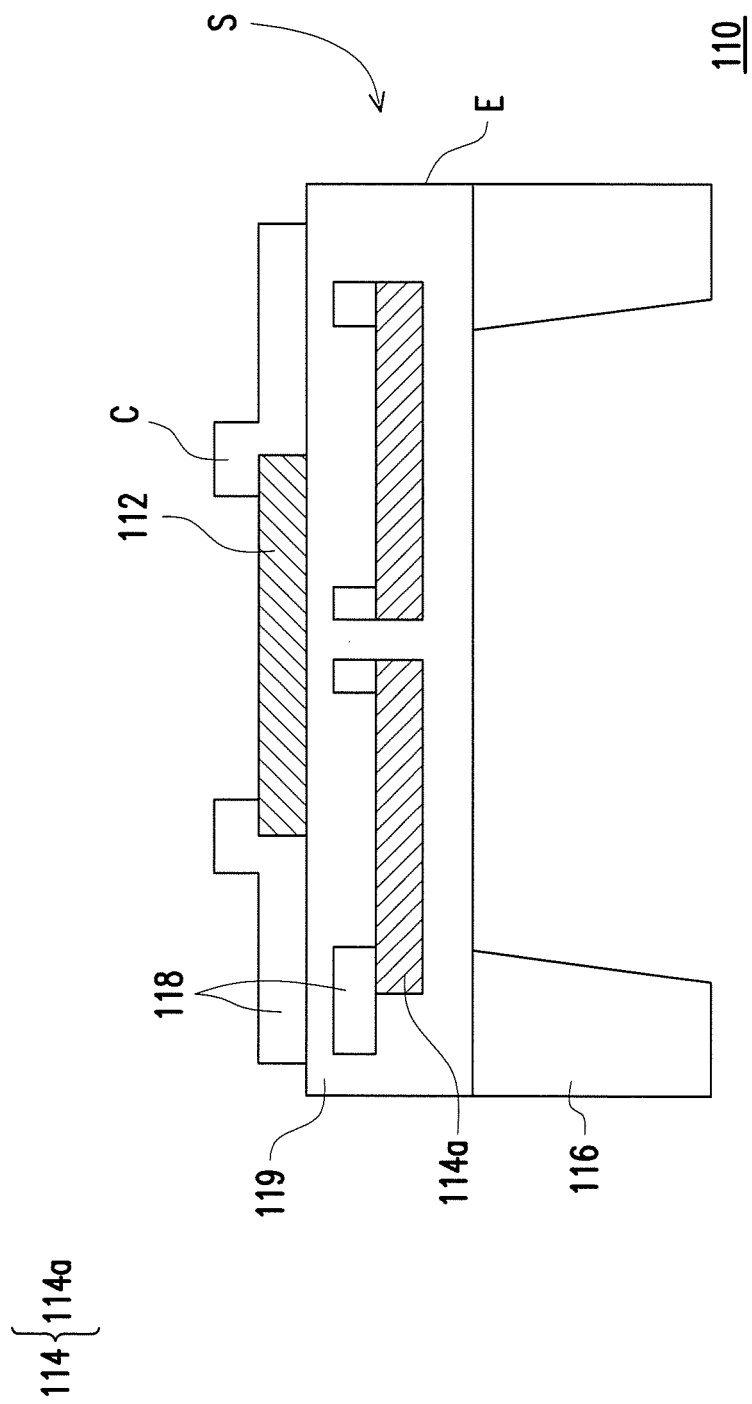
FIG. 1A is a schematic diagram of a sensor of a MEMS apparatus having measuring range selector according an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The term "electrically connected" used in this specification (including claims) of the present application may refer to any direct or indirect connection means. For example, "a first device is electrically connected to a second device" should be interpreted as "the first device is directly connected to the second device" or "the first device is indirectly connected to the second device through other devices or connection means".

Figure 1B:
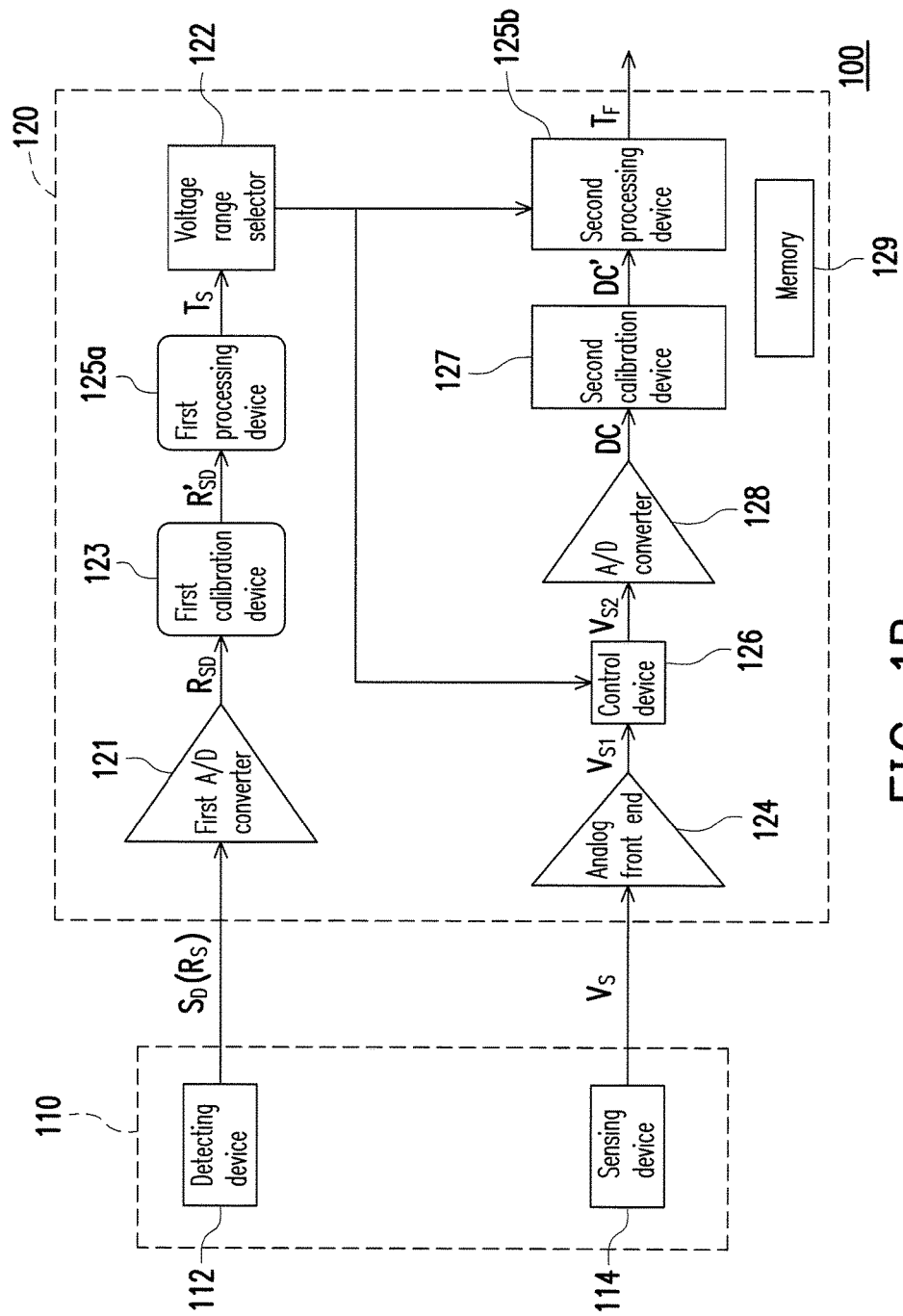
FIG. 1B is a schematic diagram of the MEMS apparatus in FIG. 1A.
Figures 2, 3:
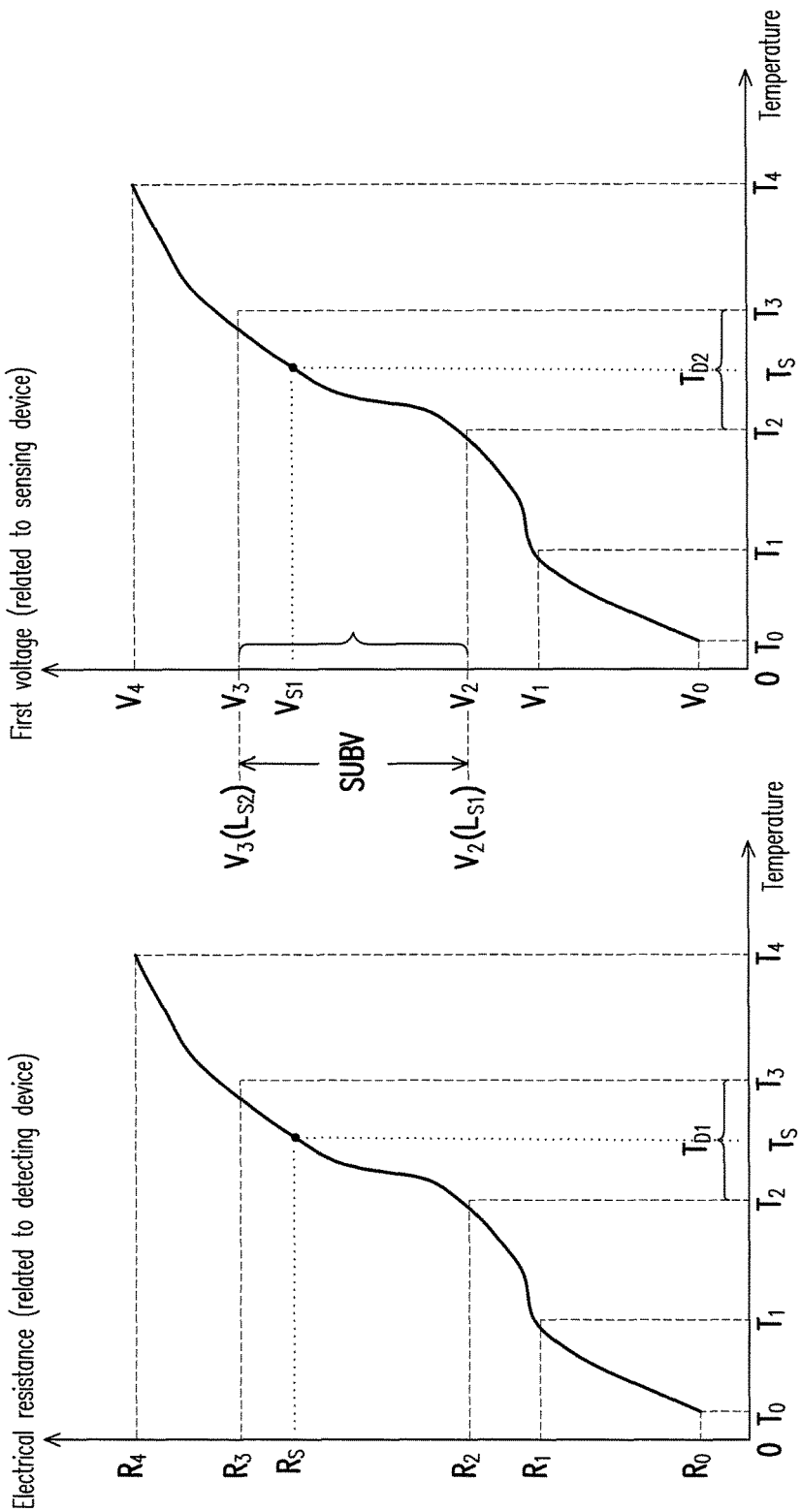
FIG. 2 is an electrical resistance-temperature diagram related to the detecting device in the embodiment of FIG. 1A and FIG. 1B.
FIG. 3 is a first voltage-temperature diagram of the sensing device in the embodiment of FIG. 1B.

FIG. 1A is a schematic diagram of a sensor of a MEMS apparatus having measuring range selector according an embodiment of the present disclosure. FIG. 1B is a schematic diagram of the MEMS apparatus in FIG. 1A. FIG. 2 is an electrical resistance-temperature diagram of the detecting device in the embodiment of FIG. 1A and FIG. 1B. FIG. 3 is a first voltage-temperature diagram of the sensing device in the embodiment of FIG. 1B. FIG. 4 is a voltage-temperature diagram obtained after the sub-voltage range SUBV in FIG. 3 is adjusted by the control device in the embodiment of FIG. 1B. FIG. 5 is a conversion relation diagram used by the A/D converter in the embodiment of FIG. 1B for making the different sub-voltage ranges to be adjusted in the full scale voltage range of FIG. 4 corresponding to different digital codes.

With reference to FIG. 1A and FIG. 1B, in the present embodiment, a MEMS apparatus 100 having measuring range selector (in short, referred to as the MEMS apparatus in the following paragraphs) is adapted to sense temperatures in different ranges. The MEMS apparatus 100 includes a sensor 110 and an IC chip 120. The sensor 110 is electrically connected to the IC chip 120.

Referring to FIG. 1A, in the present embodiment, the sensor 110 includes a detecting device 112, a sensing device 114, a substrate 116, a conductive path 118 and a film 119. The detecting device 112, the sensing device 114, the conductive path 118 and the film 119 are disposed on a side S of the substrate 116. The conductive path 118 is, for example, made of metal materials, but the present disclosure is not limited thereto. The detecting device 112 is disposed on a surface of the film 119. The sensing device 114 is disposed in the film 119. In other words, the sensing device 114 and the detecting device 112 are spaced apart by a portion of the film 119.

With reference to FIG. 1A and FIG. 1B, in the present embodiment, the detecting device 112 is configured to detect a physical quantity and generate an electrical signal $S_D$. The electrical signal $S_D$ is, for example, an electrical resistance signal $R_S$, but the present disclosure is not limited thereto. The physical quantity is, for example, a radiant heat, but the present disclosure is not limited thereto. The detecting device 112 is, for example, a thermal radiation absorbing layer, but the present disclosure is not limited thereto. The thermal radiation absorbing layer is, for example, made of NiCr or TiN, but the present disclosure is not limited thereto. The sensing device 114 is configured to detect the physical quantity and generate a sensing voltage $V_S$. The sensing device 114 includes at least one thermal pile 114a (not specifically illustrated). The at least one thermal pile 114a is, for example, made of N-type doped poly-silicon/P-type doped poly-silicon (n-poly/p-poly Si) or Cu/Cu—Ni, but the present disclosure is not limited thereto. Specifically, in the present embodiment, when receiving the radiant heat from the outside, the detecting device 112 transfers the absorbed heat to the sensing device 114. In other words, the detecting device 112 is thermally coupled to the at least one thermal pile 114a. Temperatures of the at least one thermal pile 114a is increased due to the radiant heat and thus the sensing voltage $V_S$ is generated.

In detail, in the present embodiment, the film 119 is, for example, made of silicon oxide (SiOx), but the present disclosure is not limited thereto. The substrate 116 is disposed along an edge E of the film 119, and the substrate 116 is, for example, made of silicon (Si), but the present disclosure is not limited thereto. With the above configuration, most of the radiant heat is adapted to be transferred from the detecting device 112 to the sensing device 114 via at least a portion of the film 119 but is difficult to be transferred to the substrate 116. In other words, the detecting device 112 is thermally coupled to the at least one thermal pile 114a. Accordingly, a sensing accuracy of the MEMS apparatus 100 of the present embodiment can be further improved.

On the other hand, in the present embodiment, the IC chip 120 includes a voltage range selector 122, an analog front end (AFE) 124, a control device 126, an A/D converter 128 and a memory 129. In more details, the IC chip 120 further includes a first A/D converter 121, a first calibration device 123, a first processing device 125a, a second calibration device 127 and a second processing device 125b.

In general, the detecting device 112 in the sensor 110 is electrically connected to the voltage range selector 122 in the IC chip 120 via the conductive path 118. In view of FIG. 1A, the conductive path 118 forms a plurality of contacts C (only one of which is illustrated as an example) at the edge of the sensor 110, and the detecting device 112 is, for example, electrically connected to the IC chip 120 via these contacts C. The sensing device 114 in the sensor 110 is electrically connected to the analog front end 124. The voltage range selector 122 is electrically connected to the control device 126. The control device 126 is electrically connected to the A/D converter 128.

In detail, the first A/D converter 121 is electrically connected to the detecting device 112 in the sensor 110 and the first calibration device 123. The first calibration device 123 is electrically connected to the first processing device 125a. The first processing device 125a is electrically connected to the voltage range selector 122. The voltage range selector 122 is electrically connected to the second processing device 125b. The control device 126 is electrically connected to the analog front end 124. The A/D converter 128 is electrically connected to the second calibration device 127. The second calibration device 127 is electrically connected to the second processing device 125b.

In the present embodiment, the first calibration device 123, the first processing device 125a, the second processing device 125b, the control device 126 and the second calibration device 127 may be embedded in, for example, a central processing unit (CPU) composed of single-core or multi-core, a microprocessor for general purpose or special purpose, a digital signal processor (DSP), a programmable controller, an application specific integrated circuits (ASIC), a programmable logic device (PLD) or other similar devices, or a combination of the above devices, but the present disclosure is not limited to the above. Further, the memory 129 may be, for example, a random access memory (RAM), a read-only memory (ROM) or a flash memory and the like, but the present disclosure is not limited thereto.

Specifically, in the present embodiment, the first A/D converter 121 is configured to receive the electrical signal $S_D$ (e.g., the electrical resistance signal $R_S$) from the detecting device 112 and convert the electrical resistance signal $R_S$ into a digital electrical resistance signal $R_{SD}$. The first calibration device 123 is configured to receive the digital electrical resistance signal $R_{SD}$ from the first A/D converter 121 and calibrate the digital electrical resistance signal $R_{SD}$ according to a standard blackbody (not illustrated). The first processing device 125a is configured to receive the calibrated digital electrical resistance signal $R'_{SD}$ from the first calibration device 123 and convert the calibrated digital electrical resistance signal $R'_{SD}$ into a temperature signal $T_S$. The voltage range selector 122 is configured to receive the temperature signal $T_S$ from the first processing device 125a.

Furthermore, in the present embodiment, the sensor 110 has a specification voltage range. The specification voltage range refers to a maximum voltage range of the sensing voltage $V_S$ of the sensor 110. After receiving the sensing voltage $V_S$, the analog front end 124 amplifies the sensing voltage $V_S$ and outputs a first voltage $V_{S1}$. The specification voltage range is also amplified to be a first voltage range. The voltage range selector 122 is configured to select a sub-voltage range SUBV, and the sub-voltage range SUBV is selected from the first voltage range generated by the analog front end 124. The sub-voltage range SUBV has a first lower-bound $L_{S1}$ and a first upper-bound $L_{S2}$. The voltage range selector 122 selects the sub-voltage range SUBV according to the electrical signal $S_D$ from the detecting device 112 such that the first voltage $V_{S1}$ is between the first lower-bound $L_{S1}$ and the first upper-bound $L_{S2}$. To be specific, the voltage range selector 122 is configured to select the sub-voltage range SUBV according to the temperature signal $T_S$ converted form the electrical signal $S_D$. In the following paragraphs, how the voltage range selector 122 selects the sub-voltage range SUBV will be described in details.

With reference to FIG. 2 and FIG. 3, the memory 190 stores an electrical signal-temperature diagram (specifically, an electrical resistance-temperature diagram, but the present disclosure is not limited thereto) of the detecting device 112 and a first voltage-temperature diagram of the sensing device 114. The electrical resistance-temperature diagram of the detecting device 112 and the voltage-temperature diagram of the sensing device 114 respectively include a plurality of temperature ranges, wherein the temperature ranges of the first voltage-temperature diagram are the same as the temperature ranges of the electrical resistance-temperature diagram. In the present embodiment, the electrical resistance-temperature diagram of the detecting device 112 includes temperature ranges $T_0$ to $T_1$, $T_1$ to $T_2$, $T_2$ to $T_3$ and $T_3$ to $T_4$. Similarly, the first voltage-temperature diagram of the sensing device 114 also includes the same temperature ranges $T_0$ to $T_1$, $T_1$ to $T_2$, $T_2$ to $T_3$ and $T_3$ to $T_4$. To be more specific, each of the endpoints $T_0$, $T_1$, $T_2$, $T_3$ and $T_4$ in the electrical resistance-temperature diagram of the detecting device 112 is respectively the same as each of the endpoints $T_0$, $T_1$, $T_2$, $T_3$ and $T_4$ in the voltage-temperature diagram of the sensing device 114.

Referring to FIG. 2, in the electrical resistance-temperature diagram related to the detecting device 112, the temperature range $T_0$ to $T_1$ corresponds to an electrical resistance range $R_0$ to $R_1$, the temperature range $T_1$ to $T_2$ corresponds to an electrical resistance range $R_1$ to $R_z$, the temperature range $T_2$ to $T_3$ corresponds to an electrical resistance range $R_2$ to $R_3$ and the temperature range $T_3$ to $T_4$ corresponds to an electrical resistance range $R_3$ to $R_4$. Referring to FIG. 3, in the first voltage-temperature diagram related to the sensing device 114, the temperature range $T_0$ to $T_1$ corresponds to a voltage range $V_0$ to $V_1$, the temperature range $T_1$ to $T_2$ corresponds to a voltage range $V_1$ to $V_2$, the temperature range $T_2$ to $T_3$ corresponds to a voltage range $V_2$ to $V_3$, and the temperature range $T_3$ to $T_4$ corresponds to a voltage range $V_3$ to $V_4$. It should be noted that, in FIG. 2 and FIG. 3, four temperature ranges are schematically illustrated in each of the electrical resistance-temperature diagram related to the detecting device 112 and the first voltage-temperature diagram related to the sensing device 114. Nevertheless, in other embodiments, the number of the temperature ranges can be more than four or less than four but more than two, which is not particularly limited by the present disclosure. Furthermore, the size of these temperature ranges can be different when the temperatures of objects are measured in different ranges.

Referring back to FIG. 2, furthermore, the voltage range selector 122 selects a first temperature range $T_{D1}$ corresponding to the electrical signal $S_D$ (e.g., the electrical resistance signal $R_S$) according to the electrical resistance-temperature diagram related to the detecting device 112. Herein, it is schematically illustrated that the electrical resistance signal $R_S$ measured by the detecting device 112 falls in the electrical resistance range $R_2$ to $R_3$ in the electrical resistance-temperature diagram related to the detecting device 112, and thus the temperature signal $T_S$ converted from the electrical signal $S_D$ correspondingly falls in the temperature range $T_2$ to $T_3$ (i.e., the first temperature range $T_{D1}$) in the electrical resistance-temperature diagram related to the detecting device 112. The voltage range selector 122 selects the temperature range $T_2$ to $T_3$ corresponding to the electrical resistance range $R_2$ to $R_3$ Referring to FIG. 3, next, since the temperature signal $T_S$ falls in the temperature range $T_2$ to $T_3$, the voltage range selector 122 then selects the temperature range $T_2$ to $T_3$ (i.e., a second temperature range $T_{D2}$) from the first voltage-temperature diagram related to the sensing device 114 and uses the corresponding voltage range $V_2$ to $V_3$ to be the sub-voltage range SUBV corresponding to the first voltage $V_{S1}$. It is noted that the first temperature range $T_{D1}$ and the second temperature range $T_{D2}$ have the same interval. That's to say, an upper endpoint T3 of the first temperature range $T_{D1}$ is the same as an upper endpoint T3 of the second temperature range $T_{D2}$, and a lower endpoint $T_2$ of the first temperature range $T_{D1}$ is the same as a lower endpoint $T_2$ of the second temperature range $T_{D2}$. The voltage value $V_3$ in the voltage range $V_2$ to $V_3$ is, for example, the first upper-bound $L_{S2}$ of the sub-voltage range, and the voltage value $V_2$ is, for example, the first lower-bound $L_{S1}$ of the sub-voltage range. The voltage range selector 122 selects the sub-voltage range SUBV according to the electrical signal $S_D$ ($R_S$) from the detecting device 112 such that the first voltage $V_{S1}$ is between the first lower-bound $L_{S1}$ and the first upper-bound $L_{S2}$ of the sub-voltage range SUBV. At this point, the step of selecting the sub-voltage range SUBV from a first voltage range based on the specification voltage range of the sensor 110 is completed by the voltage range selector 122.

Referring back to FIG. 1B, in the present embodiment, the analog front end 124 is configured to receive the sensing voltage $V_S$ and output the first voltage $V_{S1}$. Specifically, after receiving the sensing voltage $V_S$, the analog front end 124 amplifies the sensing voltage $V_S$ and outputs the first voltage $V_{S1}$. The control device 126 is configured to adjust the first voltage $V_{S1}$ to a second voltage $V_{S2}$. The A/D converter 128 can receive the second voltage $V_{S2}$. In the following paragraphs, how the control device 126 adjusts the first voltage $V_{S1}$ to the second voltage $V_{S2}$ will be described in details.

Referring to FIG. 3 and FIG. 4 together, in the present embodiment, the A/D converter 128 has a full scale voltage range. The full scale voltage range has a second lower-bound $V_{f1}$ and a second upper-bound $V_{f2}$. A ratio of the full scale voltage range to the sub-voltage range SUBV selected by the voltage range selector 122 (($V_{f2}-V_{f1}$)/($L_{S2}-L_{S1}$)) is defined as a gain factor GF. A difference obtained by subtracting the first lower-bound $L_{Si}$ of the sub-voltage range SUBV from the first voltage $V_{S1}$ ($V_{S1}-L_{S1}$) is defined as a shift factor SF. The control device 126 adjusts the sub-voltage range SUBV depicted in FIG. 3 to a full scale voltage range $V_{f1}$ to $V_{f2}$ depicted in FIG. 4 according to the gain factor GF and the shift factor SF. In other words, the control device 126 adjusts the first voltage $V_{S1}$ in the sub-voltage range SUBV to be the second voltage $V_{S2}$ according to the gain factor GF and the shift factor SF. The second voltage $V_{S2}$ in the full scale voltage range is obtained from the product of the gain factor GF and the shift factor SF, as shown by the equation below:

$$V_{s2} = GF \times SF = \frac{V_{f2} - V_{f1}}{SUBV} \times (V_{s1} - L_{s1}) = \frac{V_{f2} - V_{f1}}{V_3 - V_2} \times (V_{s1} - V_2)$$

In the equation above, the sub-voltage range SUBV takes the voltage range $V_3$ to $V_2$ as an example, but the present disclosure is not limited thereto.

Accordingly, the step of adjusting the first voltage $V_{S1}$ to the second voltage $V_{S2}$ is completed by the control device 126.

Referring to FIG. 5, in the present embodiment, the A/D converter 128 divides the full scale voltage range $V_{f2}$ to $V_{f1}$ into a plurality of different voltage ranges according to the number of bits of the A/D converter 128, where each voltage range corresponds to a specific digital code. In the present embodiment, the A/D converter 128 is, for example, an A/D converter with a low number of bits (e.g., 3-bits).

Specifically, the A/D converter 128 divides the full scale voltage range $V_{f2}$ to $V_{f1}$ into eight different voltage ranges. Those voltage ranges are, for example, a voltage range $V_{f1}$ to $V_{f11}$, a voltage range $V_{f11}$ to $V_{f12}$, a voltage range $V_{f12}$ to $V_{f13}$, a voltage range $V_{f13}$ to $V_{f14}$, a voltage range $V_{f14}$ to $V_{f15}$, a voltage range $V_{f15}$ to $V_{f16}$, a voltage range $V_{f16}$ to $V_{f17}$ and a voltage range $V_{f17}$ to $V_{f2}$. Each voltage range has the same interval (to be $\Delta V$), as shown by the following equation:

$$\Delta V = \frac{V_{f2} - V_{f1}}{2^3}$$

More specifically, the voltage range $V_{f1}$ to $V_{f11}$ corresponds to a digital code 000, the voltage range $V_{f11}$ to $V_{f12}$ corresponds to a digital code 001, the voltage range $V_{f12}$ to $V_{f13}$ corresponds to a digital code 010, the voltage range $V_{f13}$ to $V_{f14}$ corresponds to a digital code 011, the voltage range $V_{f14}$ to $V_{f15}$ corresponds to a digital code 100, the voltage range $V_{f15}$ to $V_{f16}$ corresponds to a digital code 101, the voltage range $V_{f16}$ to $V_{f17}$ corresponds to a digital code 110 and the voltage range $V_{f17}$ to $V_{f2}$ corresponds to a digital code 111. In the present embodiment, because it is schematically illustrated that the second voltage $V_{S2}$ falls in the voltage range $V_{f15}$ to $V_{f16}$, the A/D converter 128 converts the voltage range $V_{f15}$ to $V_{f16}$ into the digital code 101. It is noted that the resolution during temperature measurement is increased when the interval $\Delta V$ is decreased. Since the sub-voltage range SUBV is smaller than the first voltage range, the interval $\Delta V_S$ calculated from the sub-voltage range SUBV is smaller than the interval $\Delta V_1$ that calculated from the first voltage range. Therefore, the resolution of MEMS apparatus with the range selector is higher than that the MEMS apparatus without the range selector. Next, the second calibration device 127 is configured to receive a digital code DC from the A/D converter 128 and calibrate the digital code DC according to the standard blackbody. The second processing device 125b can receive the calibrated digital code DC' from the second calibration device 127 and can convert the calibrated digital code DC' into temperature information $T_F$. Further, in the present embodiment, a display (not illustrated) is further provided, and the second processing device 125b can transfer the temperature information to the display so the display can display the temperature information $T_F$.

In summary, in the MEMS apparatus having measuring range selector according to the embodiments of the present disclosure, the detecting device and the sensing device respectively generate the electrical signal and the sensing voltage according to the measured physical quantity. The voltage range selector selects the sub-voltage range from the first voltage range based on the sensor according to the electrical signal from the detecting device, such that the first voltage related to the sensing device is between the first upper-bound and the first lower-bound of the sub-voltage range. The control device in the IC chip adjusts the sub-voltage range to the full scale voltage range so the first voltage is also adjusted to the second voltage accordingly. Therefore, when the MEMS apparatus according to the embodiments of the present disclosure measures the temperatures in the different temperature ranges, the first voltage range with different sizes corresponding to the sensing device can all be adjusted to the same full scale voltage range. In this way, the MEMS apparatus according to the embodiments of the present disclosure can provide the identical or similar sensitivities when measuring the temperatures in different ranges.

Next, according to the number of bits, the second A/D converter in the IC chip can further divide the full scale voltage range into a plurality of different voltage ranges. As a result, the MEMS apparatus according to the embodiments of the present disclosure can further determine the smaller temperature range from the sub-voltage range according to the second voltage, so as to provide the higher resolution during temperature measurement.

From another perspective, because the smaller temperature range may be determined from the smaller subs-voltage range, the MEMS apparatus according to the embodiments of the present disclosure can accomplish the same resolution as that of the conventional temperature sensor which is equipped with the high bit A/D converter. Therefore, the MEMS apparatus according to the embodiments of the present disclosure can further reduce its cost.

It will be apparent to those skilled in the art that various modifications and variations can be made to the disclosed embodiments. It is intended that the specification and examples be considered as exemplary only, with a true scope of the present disclosure being indicated by the following claims and their equivalents.

What is claimed is:

1. A MEMS apparatus, comprising:
a sensor, comprising:
a sensing device, configured to detect a physical quantity and generate a sensing voltage;
an IC chip, comprising:
a voltage range selector, configured to select a sub-voltage range, wherein the sub-voltage range has a first lower-bound and a first upper-bound;
an analog front end, configured to receive the sensing voltage and output a first voltage;
a control device, configured to adjust the first voltage to a second voltage; and
an A/D converter, configured to receive the second voltage, wherein the A/D converter has a full scale voltage range, and the full scale voltage range has a second lower-bound and a second upper-bound,
wherein the first voltage is between the first lower-bound and the first upper-bound, a ratio of the full scale voltage range to the sub-voltage range is defined as a gain factor, a difference obtained by subtracting the first lower-bound from the first voltage is defined as a shift factor, and the control device is configured to adjust the first voltage to the second voltage according to the gain factor and the shift factor.

2. The MEMS apparatus of claim 1, wherein the second voltage is obtained from a product of the gain factor and the shift factor.

3. The MEMS apparatus of claim 1, wherein the analog front end has a first voltage range, and the first voltage range includes the sub-voltage range.

4. The MEMS apparatus of claim 1, wherein the physical quantity is a temperature.

5. The MEMS apparatus of claim 1, wherein the sensor further comprises a detecting device, the detecting device is configured to detect the physical quantity and generate an electrical signal, and the voltage range selector is configured to select the sub-voltage range according to the electrical signal.

6. The MEMS apparatus of claim 5, wherein the sensing device is electrically connected to the analog front end, and the detecting device is electrically connected to the voltage range selector.

7. The MEMS apparatus of claim 6, wherein the detecting device comprises a thermal radiation absorbing layer, the physical quantity is a radiant heat, and the electrical signal is an electrical resistance signal.

8. The MEMS apparatus of claim 7, wherein the sensing device comprises at least one thermal pile.

9. The MEMS apparatus of claim 5, wherein the IC chip further comprises a memory configured to store a first voltage-temperature diagram of the sensing device and an electrical signal-temperature diagram of the detecting device, and the first voltage-temperature diagram and the electrical signal-temperature diagram respectively comprise a plurality of temperature ranges, wherein the temperature ranges of the first voltage-temperature diagram are the same as the temperature ranges of the electrical signal-temperature diagram.

10. The MEMS apparatus of claim 9, wherein the electrical signal is an electrical resistance signal, and the electrical signal-temperature diagram is an electrical resistance-temperature diagram.

11. The MEMS apparatus of claim 9, wherein the voltage range selector is configured to select a first temperature range corresponding to the electrical signal according to the electrical signal-temperature diagram, the voltage range selector is configured to select a second temperature range having the same interval with the first temperature range from the first voltage-temperature diagram, and then the voltage range selector is configured to select a voltage range corresponding to the second temperature range from the first voltage-temperature diagram to be the sub-voltage range corresponding to the first voltage, wherein an upper endpoint of the first temperature range is the same as an upper endpoint of the second temperature range, and a lower endpoint of the first temperature range is the same as a lower endpoint of the second temperature range.

12. A MEMS apparatus, comprising:
a sensor, comprising:
a detecting device, configured to detect a physical quantity and generate an electrical signal;
a sensing device, configured to detect the physical quantity and generate a sensing voltage;
an IC chip, comprising:
a voltage range selector, configured to select a sub-voltage range according to the electrical signal, wherein the sub-voltage range has a first lower-bound and a first upper-bound;
an analog front end, configured to receive the sensing voltage and output a first voltage;
a control device, configured to adjust the first voltage to a second voltage; and
an A/D converter, configured to receive the second voltage, wherein the A/D converter has a full scale voltage range, and the full scale voltage range has a second lower-bound and a second upper-bound,
wherein the detecting device is electrically connected to the voltage range selector, the sensing device is electrically connected to the analog front end, the first voltage is between the first lower-bound and the first upper-bound, a ratio of the full scale voltage range to the sub-voltage range is defined as a gain factor, a difference obtained by subtracting the first lower-bound from the first voltage is defined as a shift factor, and the control device is configured to adjust the first voltage to the second voltage according to the gain factor and the shift factor.

13. The MEMS apparatus of claim 12, wherein the second voltage is obtained from a product of the gain factor and the shift factor.

14. The MEMS apparatus of claim 12, wherein the detecting device comprises a thermal radiation absorbing layer, the physical quantity is a radiant heat, and the electrical signal is an electrical resistance signal.

15. The MEMS apparatus of claim 12, wherein the sensing device comprises at least one thermal pile.

16. A MEMS apparatus, configured to sense temperatures in different ranges, the MEMS apparatus comprising:
a sensor, comprising:
a detecting device, configured to detect a physical quantity and generate an electrical signal;
a sensing device, configured to detect the physical quantity and generate a sensing voltage;
an IC chip, comprising:
a voltage range selector, configured to select a sub-voltage range according to the electrical signal, wherein the sub-voltage range has a first lower-bound and a first upper-bound;

an analog front end, configured to receive the sensing voltage and output a first voltage;

a control device, configured to adjust the first voltage to a second voltage; and an A/D converter, configured to receive the second voltage, wherein the A/D converter has a full scale voltage range, and the full scale voltage range has a second lower-bound and a second upper-bound, wherein the sensing device is electrically connected to the analog front end, the detecting device is electrically connected to the voltage range selector, the voltage range selector is configured to select the sub-voltage range according to the electrical signal such that the first voltage is between the first lower-bound and the first upper-bound, a ratio of the full scale voltage range to the sub-voltage range is defined as a gain factor, a difference obtained by subtracting the first lower-bound from the first voltage is defined as a shift factor, and the control device is configured to adjust the first voltage to the second voltage according to the gain factor and the shift factor, and the secd voltage is obtained from a product of the gain factor and the shift factor.

17. The MEMS apparatus of claim 16, wherein the IC chip further comprises a memory configured to store a first voltage-temperature diagram of the sensing device and an electrical signal-temperature diagram of the detecting device, and the first voltage-temperature diagram and the electrical signal-temperature diagram respectively comprise a plurality of temperature ranges, wherein the temperature ranges of the first voltage-temperature diagram are the same as the temperature ranges of the electrical signal-temperature diagram.

18. The MEMS apparatus of claim 16, wherein the physical quantity is a radiant heat, and the detecting device comprises a thermal radiation absorbing layer, the electrical signal is an electrical resistance signal, and the sensing device comprises at least one thermal pile.

19. The MEMS apparatus of claim 18, wherein the voltage range selector is configured to select a first temperature range corresponding to the electrical signal according to the electrical signal-temperature diagram, the voltage range selector is configured to select a second temperature range having the same interval with the first temperature range from the first voltage-temperature diagram, and then the voltage range selector is configured to select a voltage range corresponding to the second temperature range from the first voltage-temperature diagram to be the sub-voltage range corresponding to the first voltage.

20. A MEMS apparatus, configured to sense temperatures in different ranges, the MEMS apparatus comprising:

a sensor, comprising:
a sensing device, comprising at least one thermal pile, wherein the at least one thermal pile is configured to detect a radiant heat and generate a sensing voltage;
a detecting device, comprising a thermal radiation absorbing layer, wherein the thermal radiation absorbing layer is configured to detect the radiant heat and generate an electrical signal; and
a film; and an IC chip;

wherein the thermal radiation absorbing layer is disposed on a surface of the film, the at least one thermal pile is disposed in the film, a portion of the film is disposed between the thermal radiation absorbing layer and the at least one thermal pile, the detecting device is thermally coupled to the at least one thermal pile, and the thermal radiation absorbing layer is electrically connected to the IC chip.

* * * * *